NEGATIVE RESISTANCE LIGHT EMITTING SOLID STATE DIODE DEVICES

Filed April 27, 1965

INVENTORS:
SAMUEL W. ING, JR.
HAROLD A. JENSEN,
BARRY J. STERN,
BY Marvin D. Goldenberg
THEIR ATTORNEY.

United States Patent Office 3,443,166
Patented May 6, 1969

1 2

3,443,166
NEGATIVE RESISTANCE LIGHT EMITTING SOLID STATE DIODE DEVICES

Samuel W. Ing, Jr., Webster, and Harold A. Jensen, Liverpool, N.Y., and Barry J. Stern, Hammond, Ind., assignors to General Electric Company, a corporation of New York Filed Apr. 27, 1965, Ser. No. 451,122
Int. Cl. H01l *3/00, 5/00;* H03k *3/42*
U.S. Cl. 317—234 8 Claims

ABSTRACT OF THE DISCLOSURE

A negative resistance p-si-n diode device that is constructed so as to provide light emission out an end surface thereof. In one specific embodiment employing gallium arsenide, an extremely thin *p* region is zinc diffused into the semi-insulating region, on the order of .05 mil in thickness, so that the light generated in the vicinity of the p-si boundary during the state of high conduction is transmitted through the p region with relatively little attenuation. The device has application to computer circuitry in providing logic, memory and display functions.

The invention relates generally to negative resistance solid state diode devices that are light sensitive, and in particular to novel devices of this type which have the further ability to efficiently generate and emit light of high energy content.

Light sensitive solid state diode devices exhibiting a negative resistance characteristic, in the form of p-si-n diodes, were first reported by Holonyak, Jr., et al., in the Physical Review Letters, vol. 8, No. 11, June 8, 1962, "Double Injection With Negative Resistance in Semi-Insulators." The p-si-n diodes have p and n type regions formed in a body of semiconductor material, with a region of semi-insulating properties extending between the p- and n-type regions. The semi-insulating region is formed by introducing into a semiconductor material dopants that exhibit energy states close to the middle of the forbidden band gap (deep energy level states) which dopants have a net effect of removing free carriers from the conduction and/or valence band of the semiconductor material. The resistivity of the material is therefore substantially increased, and there are provided deep level trapping and/or recombination centers. The deep level centers plus a double injection phenomenon, provided by applying a forward bias potential across the diode which injects into the semi-insulating region holes from the p region and electrons from the n region, contribute the negative resistance characteristic to the p-si-n diode.

The diodes have been fabricated from a number of different semiconducting materials among which include gallium aresenide, germanium and silicon. If gallium arsenide having an impure state of n type conductivity is considered, there will be added deep level dopants such as zinc plus oxygen that compensates the n conductivity and raises the resistivity of the material to on the order of $10^3$ to $10^8$ ohm-centimeters at room temperature. A deep level dopant of acceptor variety, such as copper, is commonly added for compensating n type germanium, which raises its resistivity to between 40 to 60 ohm-centimeters at room temperature. A deep level dopant of gold is normally added to n type silicon for compensation, raising its resistivity to between 100 to $10^4$ ohm-centimeters at room temperature. A number of other semi-insulating materials exist which may be also employed in p-si-n diode fabrication.

For purposes of this invention, a semi-insulating material will be defined as a semiconductor material that has been compensated so as to raise its resistivity close to its intrinsic resistivity and provide it with deep level trapping and/or recombination centers. Further, the material is characterized by an ability to be switched between a high and low resistivity state in response to a double injection phenomenon. Depending upon the particular material employed, the normal room temperature resistivity of a semi-insulating material may be included in a range from about 40 to about $10^{12}$ ohm-centimeters.

Briefly, the action of the p-si-n diodes can be described in a physical concept as follows: The deep level electron-hole trapping and/or recombination centers, resulting from the compensation of the semiconductor material, exist in the forbidden band contained between the edges of the valence band and the conduction band. These deep level centers are totally or partially filled with electrons so that, for materials such as gallium arsenide, their hole capture cross section of $\sigma_p$ of the centers is considerably larger than their electron capture cross section $\sigma_n$. For other semi-insulating materials $\sigma_n$ may be considerably larger than $\sigma_p$. In response to a low level forward bias below a given threshold voltage $V_{th}$, which provides a double injection of holes and electrons into the semi-insulating region, a very small current will follow. This is due to the injected holes becoming captured by these centers so as to contribute very little to the total current, and to a space charge build-up at the boundary between the n and si regions which restricts the injection of electrons. As the critical threshold voltage level $V_{th}$ is approached the electric field is increased to a point where the hole transit time across the si region becomes on the order of the low level hole lifetime. This begins the negative resistance region of the V–I characteristic. The deep level centers now tend to be emptied of electrons so that the hole recombination rate decreases and lifetime increases, abruptly increasing hole current. The process neutralizes much of the space charge so that the electron current also abruptly increases. As more current is applied this phenomenon sweeps across the si region and in effect converts this region into a semiconductor region wherein both the holes and electrons contribute to a greatly increased current flow. A minimum voltage $V_m$ is rapidly reached after which the diode exhibits a low positive resistance.

The p-si-n diodes, therefore have normally two stable states, a high conductivity and a low conductivity state, between which they can be rapidly switched. The devices have switching time on the order of microseconds and can be switched by voltages compatible with microelectronic circuitry. Further, these devices are normally photosensitive so that in response to light energy of suitable wavelength, normally generated by light emitting p-n junction diodes, there is established a new threshold level at which conduction abruptly increases, that is below the normal threshold voltage.

It is accordingly a primary object of the present invention to increase the utility and extend the application of p-si-n diodes of the above described type by providing a novel diode device which in addition to the existing properties of p-si-n diodes, has a light emitting capability.

It is another object of the invention to provide a novel light emitting solid state device having a light output of energy content that is made readily compatible with the photosensitive characteristics of known p-si-n diodes.

It is still a further object of the invention to provide novel diode devices of the above described characteristics constructed so as to produce a relatively high energy value light emission therefrom.

Briefly, these and other objects of the invention are accomplished in a p-si-n diode structure which includes a p-type region, an intermediate semi-insulating region and an n-type region, wherein the semi-insulating region is composed of a compensated semiconductor material having deep level trapping and/or recombination centers with a proclivity to capture free carriers of one conductivity in preference to free carriers of the opposite conductivity, and having a double injection of holes and electrons applied thereto from the p and n type regions, the device exhibiting a negative resistance characteristic in that its impedance abruptly switches from a high impedance state to a low impedance state upon the application of a forward bias potential in excess of a given threshold level. Recombination of free carriers therein occurs, capable of generating photons of a given energy value.

In accordance with one general aspect of the invention, at least one region of the device is provided with substantially reduced thickness dimension, which dimension is appreciably less than the distance required for photon flux at said given energy value to be attenuated within said one region to a value of $1/e$ of flux intensity incident at the surface of said region, $e$ being the natural logarithm base. Photon flux may be defined as photons per $cm.^2$ per second. A thickness on the order of .01 to 1 mil may be typical.

In accordance with one specific embodiment of the invention the n-type region is formed upon a limited portion of one surface of the si-region by means of an alloying process, and the p-region is formed on the opposite surface with an exceedingly small thickness dimension in conformance with the condition above recited. In response to a forward bias exceeding a given threshold level light is emitted through the thin p-region.

With respect to a second embodiment of the invention a p-type region, which may be of conventional thickness, is formed on one surface of the si-region. By a suitable alloying and etching process, upon the p-region there is applied an n dot for forming an island of n-type region extending slightly into the si-region, the n-type region being surrounded by and separated from the p-region by a portion of the si-region of an annular configuration. Conduction occurs from the central n-region radially out to the p-region. The bulk of the si-region in this vicinity is fabricated so as to have an exceedingly small thickness dimension in conformance with the above recited condition. Upon the diode being switched to its high conductance state light is generated within the body of the diode and is transmitted through the thin si-region.

While the specification concludes with claims which set forth the invention with particularity, it is believed that the invention, both as to its organization and method of operation, will be better understood from the following description taken in connection with the accompanying drawings in which:

Figure 1A:
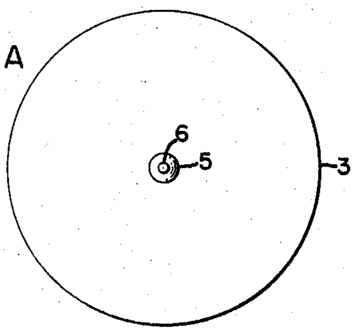
FIGURE 1A is a plan view of one embodiment of a light emitting p-si-n diode structure in accordance with the present invention.
Figure 1B:
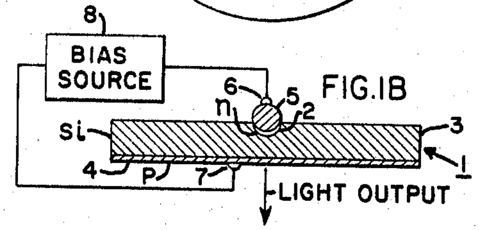
FIGURE 1B is a cross-sectional view of the p-si-n diode of FIGURE 1A.

With reference to FIGURES 1A and 1B, there is illustrated in a plan and cross-sectional view, respectively, a diode device 1 of p-si-n structure exhibiting a negative resistance characteristic which is light emissive.

The device 1 is fabricated from a semiconductor crystal wafer, the bulk of which is compensated so as to be a semi-insulating material. The device includes a limited dimension n-type region 2 formed on one surface of a semi-insulating region 3, on the opposite surface of which is formed an extremely thin planar region 4 of p-type conductivity. The n-type region is formed typically by an alloying process wherein a metal pellet 5, such as tin, is applied to the surface of the si-region and upon successive heating and cooling forms the n-region. The thin p-type region is formed preferably by a diffusion process, the region being typically zinc diffused into the si-region 3. The p and n regions are preferably doped degenerately to minimize restrictions to the densities of the holes and electrons injected into the si-region. A first ohmic contact 6 is connected to the n-type region 2 and a second ohmic contact 7 is connected to the p-type region 4 at a point offset from the area opposite the n-type region so as not to obstruct the transmitted light. Contacts 6 and 7 are adapted to have a source of exciting potential applied thereto as from a bias source 8, shown in block form, for forward biasing the diode between low level and high level conduction states.

The semiconductor material from which the diode 1 is fabricated is of a kind that can be compensated by the impregnation of a deep level dopant of opposite conductivity to the original semiconductor conductivity. The deep level dopant captures free carriers, thus appreciably increasing the resistivity of the material, and it thereby becomes a semi-insulator. A typical semiconductor material compensated to exhibit such properties is gallium arsenide. However, a number of other semiconductor materials may also be suitable for use in the invention, such as gallium phosphide or mixed crystals of gallium phosphide and gallium arsenide. In one operable embodiment of the invention, gallium arsenide which in its original state is of n type conductivity is compensated by having added to it dopants of zinc and oxygen.

Figure 2:
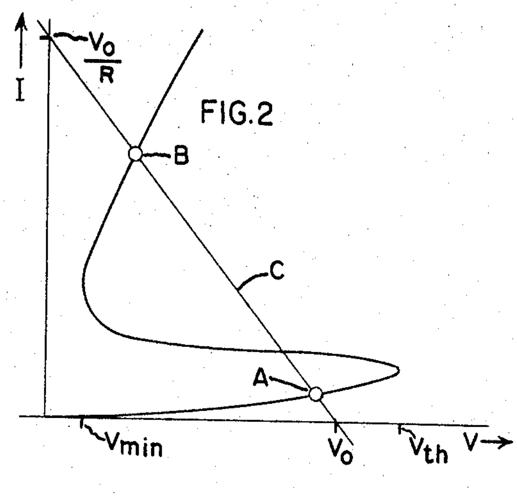
FIGURE 2 is a graph of a typical V-I characteristic of a p-si-n diode device of the type disclosed.

The p-si-n diode device 1 exhibits a negative resistance characteristic of the type illustrated by the V–I curve of FIGURE 2. With a forward bias potential applied by the source 8 to the metal contacts 6 and 7 that is of a magnitude below the threshold voltage $V_{th}$, for example $V_o$, the diode is in a low conduction state exhibiting an impedance on the order of megohms and a very small current flows. A typical value for $V_{th}$ is 10 volts. The hole capture cross section $\sigma_p$ and the electron capture cross section $\sigma_n$ of the recombination centers within the si region have an established preference whereby injected free carriers of one type conductivity are recombined into the recombination centers and do not contribute to the current flow. For the present discussion deep level centers of only the recombination type will be assumed to exist. In gallium arsenide, the hole capture cross section $\sigma_p$ is greater than the electron capture cross section $\sigma_n$ and it is the injected holes that are recombined. For this condition the hole transit time is very much greater than hole lifetime at biases lower than the threshold level. In this regard, it is noted that in order for the diode 1 to exhibit a negative resistance characteristic the mean path length through the si region 3 must be greater than a few diffusion lengths for holes at high impedance levels. Typically, the thickness of the si region, which principally determines this path length, is about 3 to 5 mils.

Figure 3:
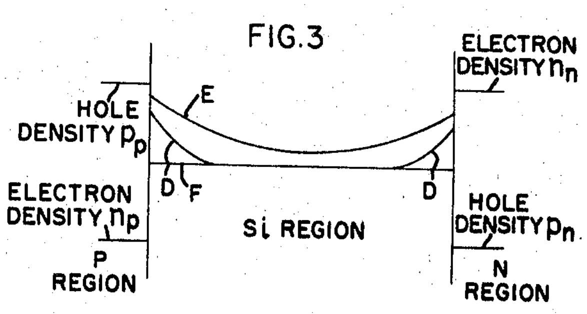
FIGURE 3 is a graph schematically illustrating in accordance with an idealized model the hole and electron densities within the three regions of the p-si-n diode of FIGURES 1A and 1B.

FIGURE 3 presents an idealized graph in accordance with Lampert's model of the hole and electron densities within the three regions of the diode 1 for conditions of low and high conductivity. The graph is intended to be a schematic rather than a rigorous representation that appears to be useful in explaining the diode mechanism. It is seen that the hole density in the p region and the electron density in the n region in the idealized condition are at fixed, relatively high levels, and the electron density in the p region and the hole density in the n region are at fixed, relatively low levels. The curve D illustrates the hole and electron densities within the si region for a low conductivity state. These densities are approximately equal to each other so that they may be schematically illustrated by a single curve. As shown by curve D, the hole and electron densities within the si region peak at the p-si and n-si boundaries and fall off to meet a reference level, corresponding to the free carrier density at thermal equilibrium, indicated by curve F.

As the bias voltage is increased to approach a threshold level $V_{th}$ in FIGURE 2, the current is seen not to increase appreciably. The injected holes continue to be recombined in the recombination centers and considerable space charge develops at the n-si boundary, which inhibits the injection of electrons. As the critical threshold voltage level $V_{th}$ is closely approached, injected holes are increased to a point where the hole transit time across the si region becomes on the order of the low level hole lifetime. Recombination centers now tend to be emptied of electrons so that the hole recombination rate decreases and lifetime increases, abruptly increasing hole current. The process neutralizes much of the space charge and the electron current also abruptly increases. The negative resistance region of the V–I characteristic is thereby entered into. As more current is applied the described phenomenon sweeps across the si region and in effect converts this region into a semiconductor region with both the holes and electrons contributing to a greatly increased current flow. The current is established at some equilibrium value as determined by external circuit conditions, at which point the diode exhibits a low positive impedance characteristic, the impedance being on the order of a few ohms.

The free carrier density within the si region for the high conductivity state may be illustrated by the curve E in FIGURE 3. It is seen that the curve E has elevated values with respect to the previously considered curve D, peaking at the p-si and n-si boundaries and falling off to a value above the reference thermal equilibrium level.

The application of a bias voltage below $V_{min}$, typically 4 volts, switches the diode back to the low conductivity state. In a typical operation in which an electrical input signal is employed to switch the diode between two stable states, a DC bias voltage is continuously applied to the diode 1, for example, of a magnitude $V_o$ having a series resistance R. A load line C may thereby be drawn intersecting the V–I curve at two stable operating points A and B. The low level operating point is at A. A positive pulse is applied, superimposed on the bias voltage $V_o$, that causes $V_{th}$ to be exceeded and the operating point switches to B. The high conductivity state remains until a negative pulse is applied which exceeds $V_{min}$ in the negative direction and the operation switches back to point A.

In the high conductivity condition considerable recombination occurs between free holes and electrons in the si-region, and also in the p- and n-regions. In gallium arsenide, a direct recombination occurs by means of the electrons in the conduction band dropping in energy and being combined with holes in the valence band. The recombination process generates photons which have been found to be of sufficient intensity to provide substantial light output from the diodes for the diode construction taught by the present invention. With respect to p-si-n diodes having si regions wherein the hole capture cross section exceeds the electron capture cross section, as in gallium arsenide si-region, it is presumed that the principle recombination process occurs within the si-region in the vicinity of the p-si boundary, e.g., within a few diffusion lengths, with possibly some recombination occurring in the p-region itself.

Figure 4:
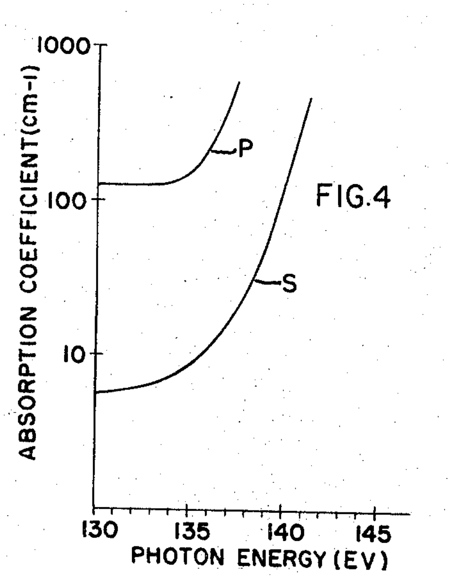
FIGURE 4 is a pair of curves illustrating the absorption coefficient versus photon energy for gallium arsenide of different doping properties.

As illustrated in FIGURE 1B, the p-region of the p-si-n diode 1 is extremely thin so as to permit light generated by the recombination processs to be transmitted through a portion of the diode material without appreciable attenuation and provide a substantial light output. It is necessary that the thickness dimension of the p-region be substantially less, preferably at least an order of magnitude less, than the distance $X_o$ required for photon flux at the energy of the emitted light to be attenuated within a sample of corresponding semiconductor material to a value of $1/e$ of the flux intensity incident at the surface of said sample. The distance $X_o$ will vary as a function of the doped material. In FIGURE 4 there are illustrated a pair of curves P and S exhibiting the absorption coefficient vs. photon energy relationships for differently doped specimens of gallium arsenide. The absorption coefficient is expressed in $cm.^{-1}$ and the photon energy in electron volts. The curve P presents absorption coefficient characteristics corresponding to those for the p-region 4. From this curve the value of $X_o$, which is the reciprocal of the absorption coefficient, can be readily obtained for various photon energy values. Similar curves may be derived for different dopant levels and different materials.

The recombination process in the diode device 1 of FIGURES 1A and 1B as fabricated from a gallium arsenide material in the manner disclosed, appears to occur within a narrowly confined region so as to emit light as from essentially a point source. The radiation wavelength for one exemplary device was found to be about 8770 A. at room temperature and about 8250 A. at liquid nitrogen temperature. For such wavelength, a p-region having a thickness of about .05 mil provides good light transmission.

Figure 5A:
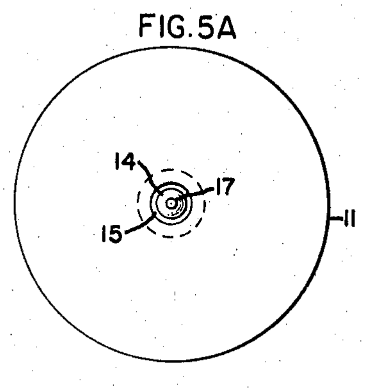
FIGURE 5A is a plan view of a light emitting p-si-n diode struction in accordance with a second embodiment of the invention.
Figure 5B:
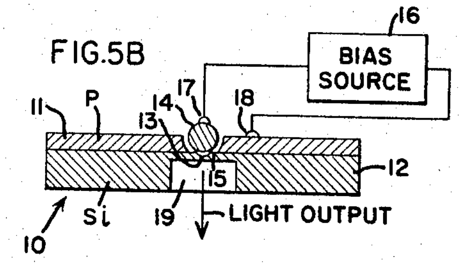
FIGURE 5B is a cross-sectional view of the diode of FIGURE 5A.

Referring now to FIGURES 5A and 5B, there is illustrated a plan and cross sectional view, respectively, of a second embodiment of the invention illustrating a p-si-n diode device 10, wherein a planar p-type region 11 is formed upon one surface of the si-region 12. By a suitable alloying and etching process an island 13 of an n-type conductivity is formed extending slightly into the si-region. This is accomplished by applying a metal pellet 14 to the surface of the p-region and etching therearound. Thus, as best indicated in FIGURE 1B, the n-region is surrounded by an annular portion 15 of the si-region, the latter forming a boundary with the p-region. A bias potential source 16 applies excitation to ohmic contacts 17 and 18 which are connected to the n- and p-regions, respectively.

Conduction occurs radially between the central n-type region 13 and the surrounding p-type region 11. The negative resistance operation of the device 10 is otherwise comparable to that described with respect to the previously considered embodiment. However, the emitted light may now be from many points along the periphery of the p-si-boundary, rather than a single point. The si-region is appreciably reduced in its thickness dimension opposite the light emitting region, as illustrated by the cut-out portion 19, in accordance with the previously considered constraints so as to permit light emitted during the high level conductivity process to be transmitted through the thin si-region.

The curve S of FIGURE 5 presents absorption coefficient characteristics corresponding to those for the si-region 12. From this curve the value of $X_o$ can be obtained, this value being found to be about an order of magnitude greater than $X_o$ for the p-region of the previously considered embodiment. Thus, the si-region is reduced so as to have a typical thickness of between .1 and 1 mil.

Figure 6:
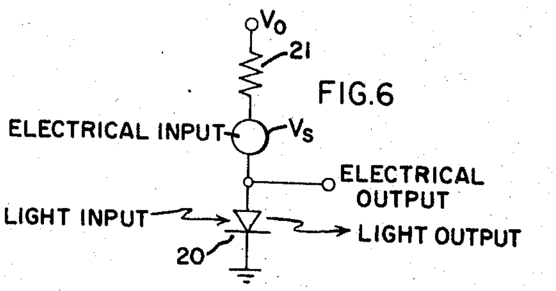
FIGURE 6 is a schematic circuit diagram of a light emitting diode in accordance with the invention.

In FIGURE 6 is presented a schematic circuit diagram of a light emitting p-si-n diode structure 20 which in general illustrates how the device may be employed. The diode 20 is constructed in accordance with the invention and is connected as a single port device. A bias voltage source $V_o$ connected through a variable series resistance 21 and electrical input source $V_s$ is applied to the diode 20. The diode may be responsive to either an electrical signal or an optical signal, as from a similarly constructed neighboring diode, not shown. With respect to the application of an electrical signal, operation is as previously described. The schematically illustrated source $V_s$ supplies a positive or negative pulse for switching the diode between its high and low conductivity states, the device providing both an electrical and an optical output that is a function of the diode's conductivity state. With respect to the application of an optical input, the bias voltage $V_o$ is established at a point intermediate the normal threshold and a reduced threshold produced by a light exposure so that in response to the light input signal, the diode switches from its low conductivity state to its high conductivity state.

The disclosed light emitting diode devices may be appreciated to be very flexible elements capable of wide application in computer circuitry, being useful for performing each of the logic, memory and display functions. They may be appreciated to have further utility in numerous read-in, read-out and signal processing applications.

Although the invention has been principally described with respect to two specific embodiments thereof for the purpose of clear and complete disclosure it should not be thereby limited. The appended claims are accordingly intended to include all modifications that fall within the true scope of the invention.

What we claim as new and desire to secure by Letters Patent of the United States is:

1. A light emitting solid state diode device comprising:
(a) a wafer of semiconductor material including a semi-insulating region fabricated to have deep level centers of different hole and electron capture cross sections, so as to exhibit a proclivity to capture free carriers of one conductivity type in preference to free carriers of the opposite conductivity type,
(b) said wafer further including a planar p-type region formed at one end surface of said wafer providing a first boundary with said semi-insulating region and an n-type region formed upon a limited portion of the opposite end surface of said wafer providing a secondary boundary with said semi-insulating region, said p- and n-type regions supplying a double injection of free carriers into said semi-insulating region in response to the application of forward bias potentials whereby said deep level centers in combination with the double injection phenomenon provide said diode devices with a negative resistance operation in which recombination occurs between free carriers that is capable of generating photons of a given energy value,
(c) said p-type region having a thickness dimension extending between said one end surface and said first boundary between about .01 and .1 mil, which is less than the reciprocal of the absorption coefficient value of said p-type region at said given energy value, whereby the generated photons may be emitted by said diode through said one end surface with an appreciable intensity.

2. A light emitting solid state diode device as in claim 1 wherein said semiconductor material is gallium arsenide.

3. A light emitting solid state diode device as in claim 1 wherein said p-type region is a diffused layer extending into said semi-insulating region.

4. A light emitting solid state diode device comprising:
(a) a wafer of semiconductor material including a semi-insulating region fabricated to have deep level centers of different hole and electron capture cross sections, so as to exhibit a proclivity to capture free carriers of one conductivity type in preference to free carriers of the opposite conductivity type,
(b) said wafer further including a planar p-type region formed at one end surface of said wafer providing a first boundary with said semi-insulating region and an island of n-type region formed also at said one end surface within an opening provided in said p-type region so that an annular portion of the semi-insulating region separates said p- and n-type regions providing a second boundary of said semi-insulating region, said p- and n-type regions supplying a double injection of free carriers into said semi-insulating region in response to the application of forward bias potentials whereby said deep level centers in combination with the double injection phenomenon provide said diode device with a negative resistance operation in which recombination occurs between free carriers that is capable of generating photons of a given energy value,
(c) said semi-insulating region in the vicinity of said island having a thickness dimension extending between a second end surface opposite said one end surface and said first boundary less than the reciprocal of the absorption coefficient value of said p-type region at said given energy value, whereby photons may be emitted by said diode through said second end surface with an apprecibale intensity.

5. A light emitting solid state diode device as in claim 4 wherein said semiconductor material is gallium arsenide.

6. A light emitting solid state diode device as in claim 5 wherein said thickness dimension is between about .1 and 1 mil.

7. A light emitting solid state diode device as in claim 6 wherein said p-type region is a diffused layer extending into said one surface and said n-type region is formed by alloying an n-dot upon a portion of said p-type region so as to extend into said semi-insulating region, the p-type region immediately surrounding said n-dot being etched away.

8. A light emitting solid state diode device comprising:
(a) a wafer of semiconductor material including a semi-insulating region fabricated to have deep level centers of different hole and electron capture cross sections, so as to exhibit a proclivity to capture free carriers of one conductivity type in preference to free carriers of the opposite conductivity type.
(b) said wafer further including a p-type region forming a first boundary with said semi-insulating region and an n-type region forming a second boundary with said semi-insulating region, a portion of said semi-insulating region thereby being intermediate said p- and n-type regions, said p- and n-type regions supplying a double injection of free carriers into said semi-insulating region in response to the application of forward bias potentials whereby said deep level centers in combination with the double injection phenomenon provide said diode device with a negative resistance operation in which recombination occurs between free carriers that is capable of generating photons of a given energy value,
(c) said semi-insulating region being formed at one end surface of said wafer having a thickness dimension extending between said one end surface and one of said boundaries between about .1 and 1 mil, which is less than the reciprocal of the absorption coefficient value of said semi-insulating region at said given energy value, whereby the generated photons may be emitted by said diode through said one end surface with an appreciable intensity.

References Cited

UNITED STATES PATENTS 3,293,513 12/1966 Biard ______________ 317—237

JOHN W. HUCKERT, *Primary Examiner.*

M. EDLOW, *Assistant Examiner.*

U.S. Cl. X.R.

307—311, 324; 317—235